(12) United States Patent
Penney

(10) Patent No.: US 10,431,294 B2
(45) Date of Patent: Oct. 1, 2019

(54) WRITE LEVEL ARBITER CIRCUITRY

(71) Applicant: Micron Technology, Inc., Boise, ID (US)

(72) Inventor: Daniel B. Penney, Wylie, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/051,210

(22) Filed: Jul. 31, 2018

(65) Prior Publication Data

US 2019/0259446 A1    Aug. 22, 2019

Related U.S. Application Data

(60) Provisional application No. 62/631,760, filed on Feb. 17, 2018.

(51) Int. Cl.
| | |
|---|---|
| G11C 7/00 | (2006.01) |
| G11C 11/4093 | (2006.01) |
| G11C 11/4076 | (2006.01) |
| G06F 13/18 | (2006.01) |
| G11C 7/22 | (2006.01) |

(52) U.S. Cl.
CPC .......... G11C 11/4093 (2013.01); G06F 13/18 (2013.01); G11C 7/22 (2013.01); G11C 11/4076 (2013.01)

(58) Field of Classification Search
CPC ... G11C 11/4093; G11C 7/22; G11C 11/4076; G06F 13/18
USPC .................................................. 365/193, 194
See application file for complete search history.

(56) References Cited

U.S. PATENT DOCUMENTS

| | | | | |
|---|---|---|---|---|
| 7,928,770 | B1* | 4/2011 | Bellis ................... | G11C 7/1051 326/38 |
| 8,283,955 | B2* | 10/2012 | Redman-White .... | G11C 7/1051 327/147 |
| 8,917,113 | B1* | 12/2014 | Song ...................... | G01R 25/00 327/3 |
| 2004/0105292 | A1* | 6/2004 | Matsui ................ | G06F 13/4243 365/63 |
| 2006/0221008 | A1* | 10/2006 | Seki ...................... | G09G 3/2044 345/76 |
| 2008/0126822 | A1* | 5/2008 | Kim ..................... | G11C 7/1078 713/500 |
| 2008/0164922 | A1* | 7/2008 | Yun ...................... | H03K 5/1565 327/160 |
| 2008/0205170 | A1* | 8/2008 | Ikeda ................... | G11C 29/02 365/193 |

(Continued)

OTHER PUBLICATIONS

PCT International Search Report & Written Opinion for PCT Application No. PCT/ US2018/053921 dated Jan. 25, 2019; 12 Pages.

*Primary Examiner* — Viet Q Nguyen
(74) *Attorney, Agent, or Firm* — Fletcher Yoder, P.C.

(57) ABSTRACT

Devices and methods include utilizing memory including a group of storage elements, such as memory banks. A command interface is configured to receive a write command to write data to the memory. A data strobe is received to assist in writing the data to the memory. Phase division circuitry is configured to divide the data strobe into a plurality of phases to be used in writing the data to the memory. Arbiter circuitry is configured to detect which phase of the plurality of phases captures a write start signal for the write command.

17 Claims, 6 Drawing Sheets

(56) References Cited

U.S. PATENT DOCUMENTS

| | | | |
|---|---|---|---|
| 2009/0213663 A1* | 8/2009 | Johnson | G11C 7/1006 365/189.02 |
| 2009/0251181 A1* | 10/2009 | Bae | G11C 7/22 327/156 |
| 2010/0299644 A1* | 11/2010 | Kawai | G11C 7/1051 716/113 |
| 2011/0069560 A1* | 3/2011 | Vo | G11C 7/1027 365/189.05 |
| 2012/0119804 A1 | 5/2012 | Ma | |
| 2012/0188828 A1* | 7/2012 | Vo | G11C 7/1027 365/189.05 |
| 2013/0182516 A1 | 7/2013 | Kinoshita | |
| 2013/0250693 A1* | 9/2013 | Shimizu | G11C 16/32 365/185.18 |
| 2014/0204685 A1 | 7/2014 | Johnson | |
| 2015/0187404 A1* | 7/2015 | Oh | G11C 8/18 365/154 |
| 2015/0235683 A1* | 8/2015 | Song | G11C 7/1093 365/189.05 |
| 2016/0035409 A1* | 2/2016 | Gopalan | G11C 11/4076 365/193 |
| 2016/0172018 A1* | 6/2016 | Nam | H03K 5/1502 365/189.05 |
| 2016/0196864 A1 | 7/2016 | Ware et al. | |
| 2017/0270982 A1* | 9/2017 | Song | G11C 7/22 |
| 2018/0294026 A1* | 10/2018 | Lee | G11C 11/34 |

\* cited by examiner

WRITE LEVEL ARBITER CIRCUITRY

CROSS-REFERENCE TO RELATED APPLICATIONS

This application claims priority to U.S. Provisional Patent Application 62/631,760, entitled "DDR5 Memory Device," and filed on Feb. 17, 2018, which this application incorporates entirely for all purposes.

BACKGROUND

Field of the Present Disclosure

Embodiments of the present disclosure relate generally to the field of semiconductor devices. More specifically, embodiments of the present disclosure relate to a memory device feeding back information to a host device to set write levels for writes from the host device to the memory device.

Description of Related Art

Semiconductor devices (e.g., memory devices) often receive write operations and send feedback to the host device to cause the host device to set a proper write level for write operations. The semiconductor devices also utilize clocks to perform functions. As frequency speeds increase, it may be helpful to divide a fast clock into multiple phases for internal use of a portion of the fast clock (e.g., in dynamic random-access memory (DRAM)). However, by dividing the clock into multiple phases, it may be unknown as to which starting phase first receives a first incoming clock for the clock to send the feedback to the host device.

Embodiments of the present disclosure may be directed to one or more of the problems set forth above.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

At fast clock frequencies, such as those used for DDR5, an external clock frequency may be divided from internal use by the DRAM. For example, a number (e.g., 4) phases may be generated internally for the single external clock. When dividing the clock for a data strobe pin (DQS), the starting state due to the phase divider may not be known at the time a write command is entered because the DQS clock may start and stop only when write data bursts are received. These bursts may occur so close together that there is not enough time to reset the DQS clock circuitry between bursts. However, which phase coming out of the generator is leading should be known in order to correctly capture the write data and send feedback to the host device to set the appropriate write level for the write operation. Thus, arbiter circuitry may be used to detect which of the phases first captures the write operation via a write start signal. In some embodiments, detection of which phase properly captures the write operation may vary by a length of a write preamble. Accordingly, the arbiter circuitry may include multiplexing circuitry that selects which phase to use based at least in part on a length of a preamble for the write operation.

Figure 1:
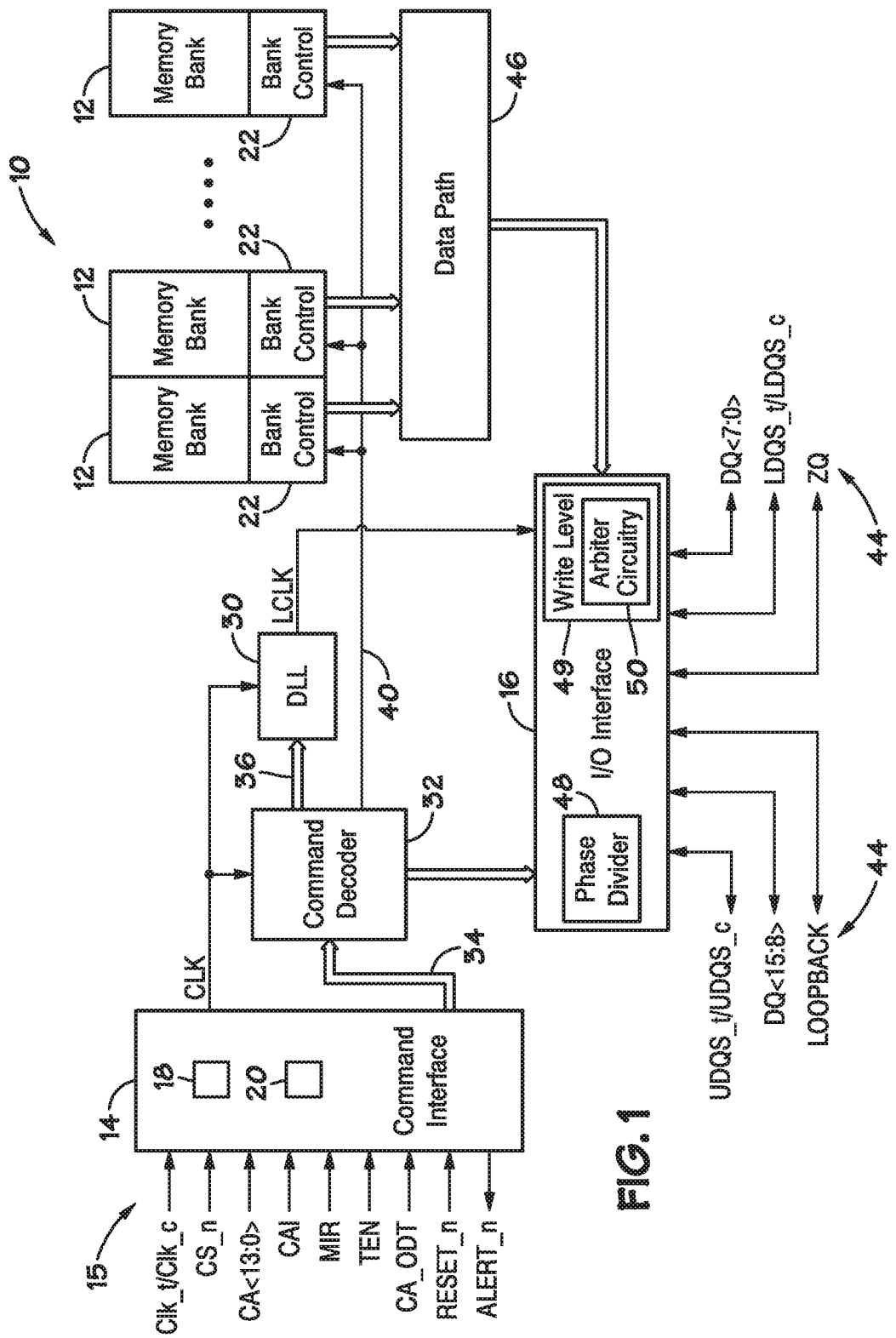
FIG. 1 is a simplified block diagram illustrating certain features of a memory device that receives write start signals and DQS signals from a host device, according to an embodiment of the present disclosure.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a double data rate type five synchronous dynamic random access memory (DDR5 SDRAM) device. Various features of DDR5 SDRAM allow for reduced power consumption, more bandwidth and more storage capacity compared to prior generations of DDR SDRAM.

The memory device 10, may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMS). Each DIMM may include a number of SDRAM memory chips (e.g., x8 or x16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabyte (Gb) DDR5 SDRAM, the memory chip may include 16 memory banks 12, arranged into 8 bank groups, each bank group including 2 memory banks. For a 16 Gb DDR5 SDRAM, the memory chip may include 32 memory banks 12, arranged into 8 bank groups, each bank group including 4 memory banks, for instance. Various other configurations, organization and sizes of the memory banks 12 on the memory device 10 may be utilized depending on the application and design of the overall system.

The memory device 10 may include a command interface 14 and an input/output (I/O) interface 16. The command interface 14 is configured to provide a number of signals (e.g., signals 15) from an external device (not shown), such as a processor or controller. The processor or controller may provide various signals 15 to the memory device 10 to facilitate the transmission and receipt of data to be written to or read from the memory device 10.

As will be appreciated, the command interface 14 may include a number of circuits, such as a clock input circuit 18 and a command address input circuit 20, for instance, to ensure proper handling of the signals 15. The command interface 14 may receive one or more clock signals from an external device. Generally, double data rate (DDR) memory utilizes a differential pair of system clock signals, referred to herein as the true clock signal (Clk_t/) and the bar clock signal (Clk_b). The positive clock edge for DDR refers to the point where the rising true clock signal Clk_t/ crosses the falling bar clock signal Clk_b, while the negative clock edge indicates that transition of the falling true clock signal Clk_t and the rising of the bar clock signal Clk_b. Commands (e.g., read command, write command, etc.) are typically entered on the positive edges of the clock signal and data is transmitted or received on both the positive and negative clock edges.

The clock input circuit 18 receives the true clock signal (Clk_t/) and the bar clock signal (Clk_b) and generates an internal clock signal CLK. The internal clock signal CLK is supplied to an internal clock generator, such as a delay locked loop (DLL) circuit 30. The DLL circuit 30 generates a phase controlled internal clock signal LCLK based on the received internal clock signal CLK. The phase controlled internal clock signal LCLK is supplied to the I/O interface 16, for instance, and is used as a timing signal for determining an output timing of read data. In some embodiments, as discussed below, the clock input circuit 18 may include circuitry that splits the clock signal into multiple (e.g., 4) phases. The clock input circuit 18 may also include phase detection circuitry to detect which phase receives a first pulse when sets of pulses occur too frequently to enable the clock input circuit 18 to reset between sets of pulses.

The internal clock signal(s)/phases CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the DLL circuit 30 over the bus 36 to coordinate generation of the phase controlled internal clock signal LCLK. The phase controlled internal clock signal LCLK may be used to clock data through the IO interface 16, for instance.

Further, the command decoder 32 may decode commands, such as read commands, write commands, mode-register set commands, activate commands, etc., and provide access to a particular memory bank 12 corresponding to the command, via the bus path 40. As will be appreciated, the memory device 10 may include various other decoders, such as row decoders and column decoders, to facilitate access to the memory banks 12. In one embodiment, each memory bank 12 includes a bank control block 22 which provides the necessary decoding (e.g., row decoder and column decoder), as well as other features, such as timing control and data control, to facilitate the execution of commands to and from the memory banks 12.

The memory device 10 executes operations, such as read commands and write commands, based on the command/address signals received from an external device, such as a processor. In one embodiment, the command/address bus may be a 14-bit bus to accommodate the command/address signals (CA<13:0>). The command/address signals are clocked to the command interface 14 using the clock signals (Clk_t/ and Clk_b). The command interface may include a command address input circuit 20 which is configured to receive and transmit the commands to provide access to the memory banks 12, through the command decoder 32, for instance. In addition, the command interface 14 may receive a chip select signal (CS_n). The CS_n signal enables the memory device 10 to process commands on the incoming CA<13:0> bus. Access to specific banks 12 within the memory device 10 is encoded on the CA<13:0> bus with the commands.

In addition, the command interface 14 may be configured to receive a number of other command signals. For instance, a command/address on die termination (CA_ODT) signal may be provided to facilitate proper impedance matching within the memory device 10. A reset command (RESET_n) may be used to reset the command interface 14, status registers, state machines and the like, during power-up for instance. The command interface 14 may also receive a command/address invert (CAI) signal which may be provided to invert the state of command/address signals CA<13:0> on the command/address bus, for instance, depending on the command/address routing for the particular memory device 10. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data may be sent to and from the memory device 10, utilizing the command and clocking signals discussed above, by transmitting and receiving data signals 44 through the IO interface 16. More specifically, the data may be sent to or retrieved from the memory banks 12 over the datapath 46, which includes a plurality of bi-directional data buses. Data IO signals, generally referred to as DQ signals, are generally transmitted and received in one or more bi-directional data busses. For certain memory devices, such as a DDR5 SDRAM memory device, the IO signals may be divided into upper and lower bytes. For instance, for a x16 memory device, the IO signals may be divided into upper and lower IO signals (e.g., DQ<15:8> and DQ<7:0>) corresponding to upper and lower bytes of the data signals, for instance.

To allow for higher data rates within the memory device 10, certain memory devices, such as DDR memory devices may utilize data strobe signals, generally referred to as DQS signals. The DQS signals are driven by the external processor or controller sending the data (e.g., for a write command) or by the memory device 10 (e.g., for a read command). For read commands, the DQS signals are effectively additional data output (DQ) signals with a predetermined pattern. For write commands, the DQS signals are used as clock signals to capture the corresponding input data. As with the clock signals (Clk_t/ and Clk_b), the DQS signals may be provided as a differential pair of data strobe signals (DQS_t/ and DQS_b) to provide differential pair signaling during reads and writes. For certain memory devices, such as a DDR5 SDRAM memory device, the differential pairs of DQS signals may be divided into upper and lower data strobe signals (e.g., UDQS_t/ and UDQS_b; LDQS_t/ and LDQS_b) corresponding to upper and lower bytes of data sent to and from the memory device 10, for instance. In some embodiments, as discussed below, the IO interface 16 may include phase divider circuitry 48 that splits the DQS signal into multiple (e.g., 4) phases.

The IO interface 16 may also include write leveling circuitry 49 that performs write leveling. During write leveling, the result of an attempt to capture an incoming write command with the DQS signal is fed back to the host device. Using this feedback, the host device may adjust the phase of the DQS accordingly depending on whether the capture was successful or not. When using a four-phase DQS internally in the DRAM using the phase divider circuitry 48, it may be difficult or impossible to determine which phase fires first. However, the feedback utilizes the result of the first phase. Accordingly, the write level circuitry 49 includes arbiter circuitry 50 that detects which phase fires first and then delivers that result to the host device.

An impedance (ZQ) calibration signal may also be provided to the memory device 10 through the IO interface 16. The ZQ calibration signal may be provided to a reference pin and used to tune output drivers and ODT values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/VSS external to the memory device 10. This resistor acts as a reference for adjusting internal ODT and drive strength of the IO pins.

In addition, a loopback signal (LOOPBACK) may be provided to the memory device 10 through the IO interface 16. The loopback signal may be used during a test or debugging phase to set the memory device 10 into a mode wherein signals are looped back through the memory device 10 through the same pin. For instance, the loopback signal may be used to set the memory device 10 to test the data output (DQ) of the memory device 10. Loopback may include both a data and a strobe or possibly just a data pin. This is generally intended to be used to monitor the data captured by the memory device 10 at the IO interface 16.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), etc., may also be incorporated into the memory device 10. Accordingly, it should be understood that the block diagram of FIG. 1 is only provided to highlight certain functional features of the memory device 10 to aid in the subsequent detailed description.

Figure 2:
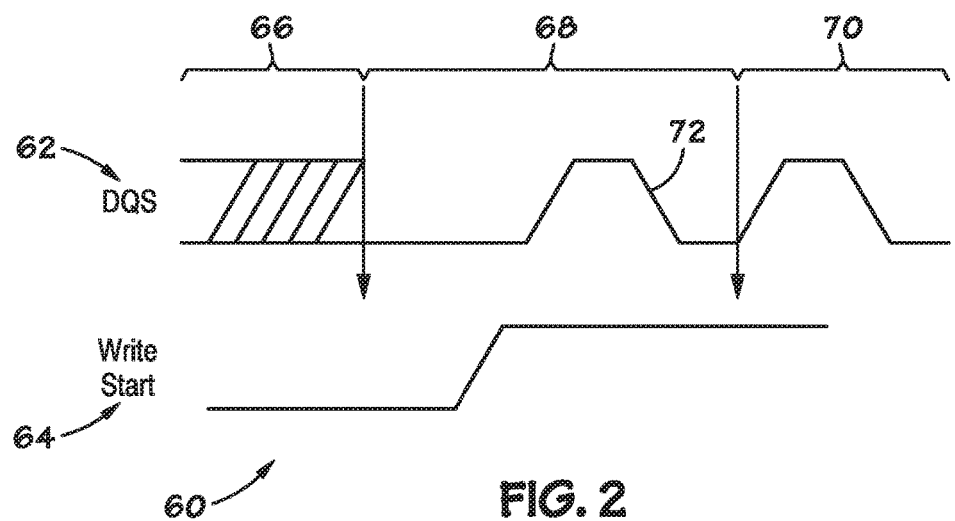
FIG. 2 is a timing diagram showing a DQS signal of FIG. 1 relative to a write start signal provided by a host device, according to an embodiment of the present disclosure.

FIG. 2 is a timing diagram 60 showing a DQS signal 62 relative to a write start signal 64. The DQS signal 62 is provided by the host device and may undergo delays and/or conversions for internal use within the memory device 10. A received write command may be shifted using a cas write latency (CWL) shifter to begin the start of the write start signal 64. During a first portion 66 before a write operation has promulgated through the memory device 10 from the host device, the DQS signal 62 may be in an undriven, indeterminate state. The write operation may be divided into a preamble 68 and a data transfer 70. The illustrated preamble 68 has a duration of 2 nCKs of the DQS signal 62. In some embodiments, the write operation may also include a postamble (not pictured) that occurs after the data transfer 70 portion of the write operation. A first falling edge 72 of the DQS signal 62 is used by the memory device 10 to capture the write start signal 64. However, if the DQS signal 62 is out-of-phase with the write start signal 64, the write start signal 64 may not be captured by the first falling edge of the DQS signal 62. Thus, the host device may adjust the phase of the DQS signal 62 if the write start is not captured properly. However, since this adjustment occurs at the beginning of the write operation, a first phase of a multi-phase DQS occurring with a pulse of the write start signal 64 is to be checked for alignment with the write start signal 64, in accordance with embodiments described herein.

Figure 3:
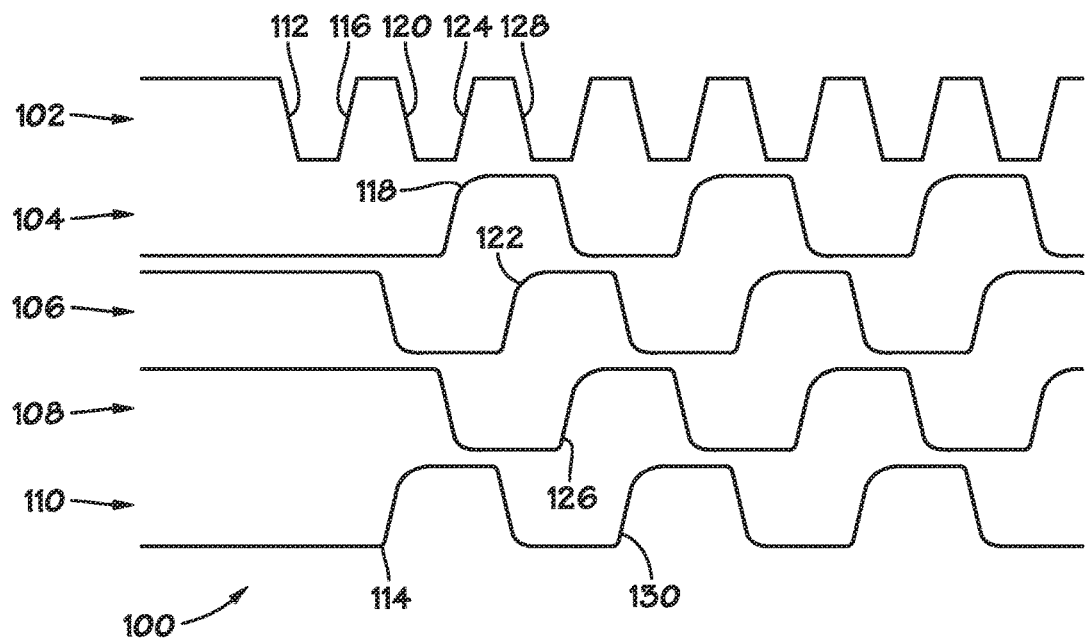
FIG. 3 is a graph of an external data strobe and multiple phases of the data strobe from phase division circuitry of the memory device, according to an embodiment of the present disclosure.

FIG. 3 illustrates a graph 100 showing waveforms 102, 104, 106, 108, and 110. The waveform 102 illustrates an embodiment of a DQS signal. The waveform 104 illustrates a first phase (DS0) of the DQS signal corresponding to alternating rising edges of the DQS signal. The waveform 106 illustrates a second phase (DS180) of the DQS signal corresponding to alternating falling edges of the DQS signal. The waveform 108 illustrates a third phase (DS360) of the DQS signal corresponding to other alternating rising edges of the DQS signal. The waveform 110 illustrates a fourth phase (DS540) of the DQS signal corresponding to other alternating falling edges of the DQS signal. As illustrated, the waveform 102 has a first frequency, and the waveforms 104, 106, 108, and 110 have a frequency that is half the frequency of the first frequency since the waveforms 104, 106, 108, and 110 transition for every other respective edge of the waveform 102.

A falling edge 112 of the waveform 102 causes a rise 114 of the waveform 110. Similarly, a rising edge 116 of the waveform 102 causes a rise 118 of the waveform 104. Likewise, a falling edge 120 of the waveform 102 causes a rise 122 of the waveform 106, and a rising edge 124 of the waveform 102 causes a rise 126 of the waveform 108. A falling edge 128 of the waveform 102 causes another rise 130 of the waveform 110.

Figure 4:
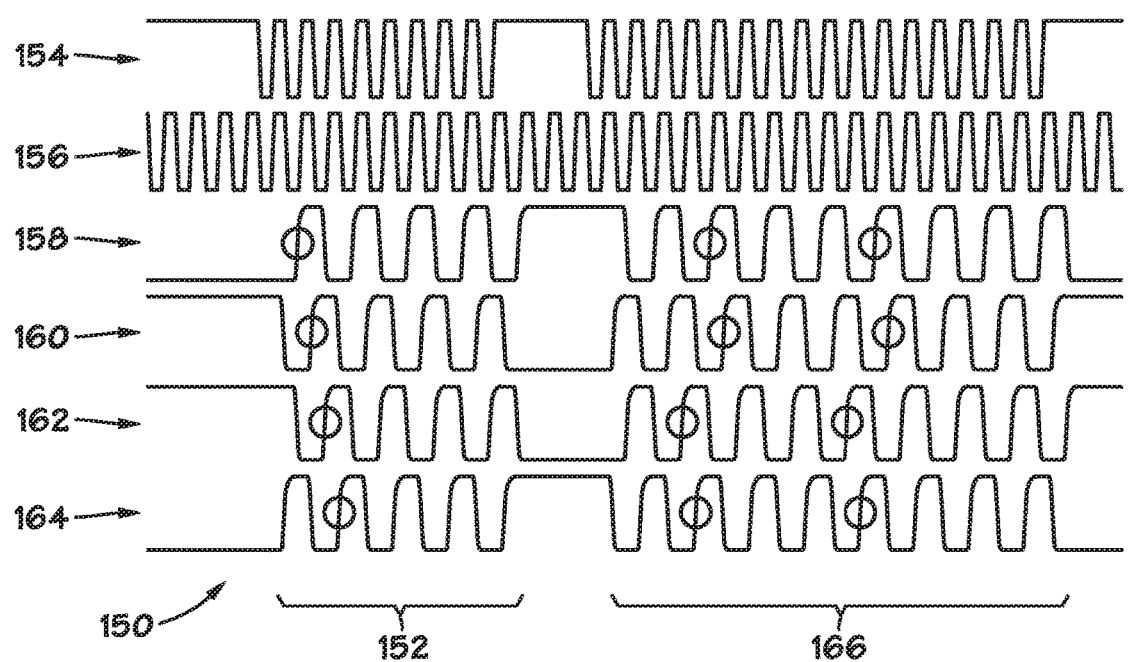
FIG. 4 is a timing diagram of a data strobe and multiple phases of the data strobe from the phase division circuitry of the memory device of FIG. 1 with two bursts without a reset between the bursts, according to an embodiment of the present disclosure.

FIG. 4 illustrates a graph 150 depicting a possible detection issue with the phase divider circuitry 48. Namely, an ordering of the phases output from the phase divider circuitry 48 may be dependent upon a starting state of the phase divider circuitry 48. The DQS signal may be a discontinuous clock. Thus, it may be started and stopped such that it is only active for write data entry. Additionally or alternatively, the DQS signal may go indeterminate when not used during a write operation to save power. This indeterminacy may also change the starting state of the phase divider circuitry 48 for a write burst. For at least these reasons, the starting state may vary between different write data entry bursts. Moreover, this variation may depend upon a length of the bursts and/or whether preamble/postamble edges are included in the DQS signal. Furthermore, use of a Cyclical Redundancy Check (CRC) may add an extra rise edge and extra fall edge to the DQS signal for a write data entry burst. This extra rise edge and extra fall edge may change the starting state of the multi-phase generator for the next write command.

Specifically, as illustrated, it may be difficult to determine which phase (e.g., DS0 or DS360) of the DQS signal captures the first bit of write data. Specifically, as illustrated, a first burst 152 of DQS pulses 154 aligned to a clock 156 causes pulses in an order of waveform 158 (DS0), waveform 160 (DS180), waveform 162 (DS360), and then waveform 164 (DS540). However, a second burst 166 causes pulses in an order of waveform 162 (DS360), waveform 164 (DS540), waveform 158 (DS0), and then waveform 160 (DS180).

As previously noted, arbiter circuitry 50 may be used to detect which phase (e.g., DS180 or DS540) corresponding to a particular edge type (e.g., falling edge) fires first and then delivers the result to the host device for write leveling and/or other purposes.

Figure 5:
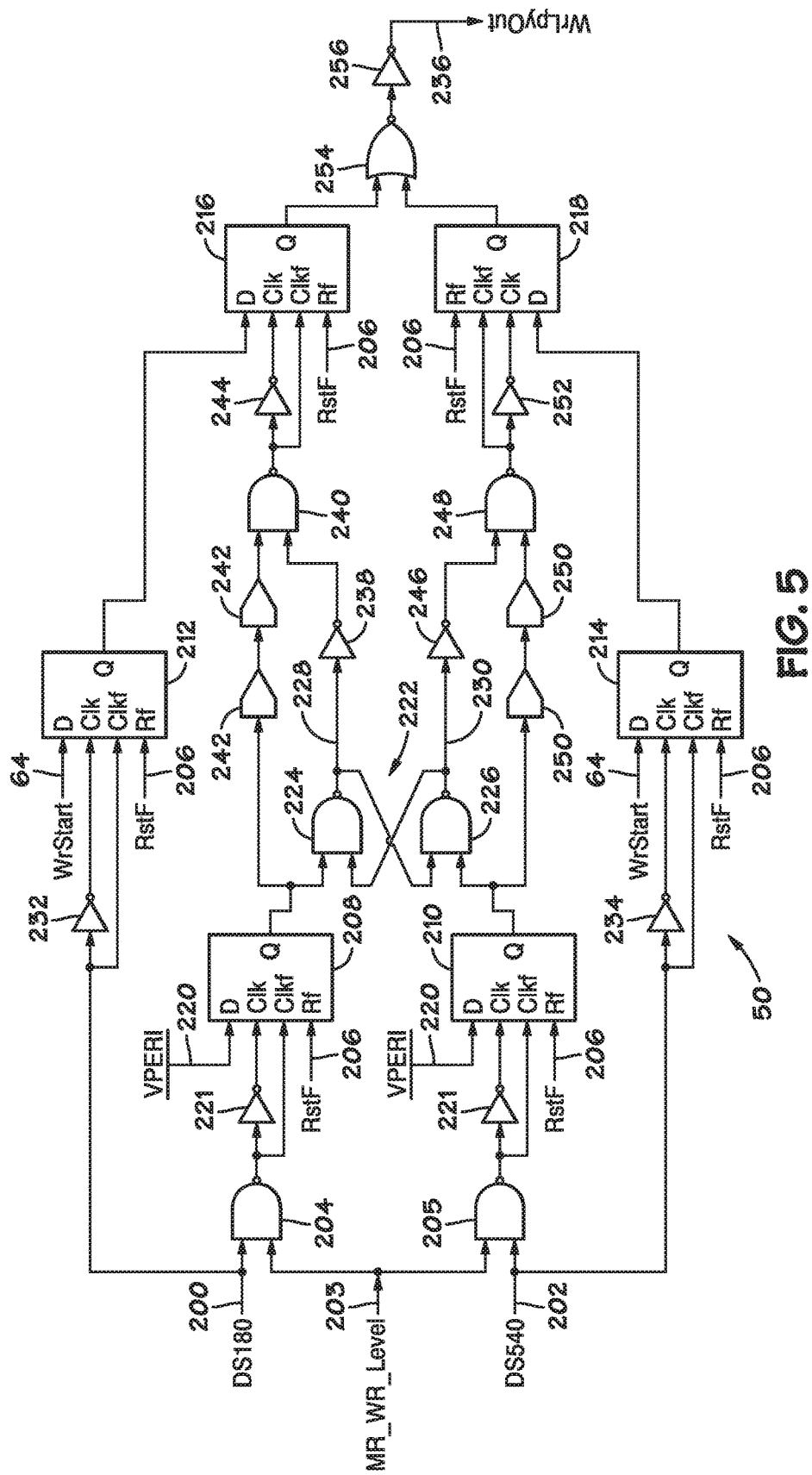
FIG. 5 is a schematic diagram of arbiter circuitry that is used to detect which of the multiple phases of FIG. 3 is used to capture a write start signal for write leveling, according to an embodiment of the present disclosure.

FIG. 5 illustrates a schematic diagram of the arbiter circuitry 50 that is used to detect whether a first phase 200 or second phase 202 pulses first when write leveling is asserted. Write leveling may be asserted using an MR_WR_LEVEL signal 203. By activating the arbiter circuitry 50 only when the MR_WR_LEVEL signal 203 via NAND gates 204 and 205, power consumption for the write leveling circuitry 49 and/or the arbiter circuitry 50 may be reduced when write leveling is not asserted. When the MR_WR_LEVEL signal 203 is asserted, a reset may be asserted to the arbiter circuitry 50 using a RstF signal 206 to reset flip-flops 208, 210, 212, 214, 216, and 218. The reset may also be used to reset the phase divider circuitry 48 that generates the first phase 200 and the second phase 202. From the reset condition, the first phase 200 and the second phase 202 start at a low value. Either the first phase 200 or the second phase 202 will transition high first to capture the write start signal 64. However, which phase will fire first may be unknown. Instead, the flip-flops 208 and 210 may be used to flag the detection. Specifically, each of the flip-flops 208 and 210 have input terminals coupled to a voltage 220. The flip-flop 208 clocks in the voltage 220 when the first phase 200 transitions high, and the flip-flop 210 clocks in the voltage 220 when the second phase 202 transitions high. The flip-flops 208 and 210 may utilize inverters 221 to invert the first and second phases 200, 202 to use differential clocking for the flip-flops 208 and 210.

Outputs of the flip-flops 208 and 210 are submitted to a latch 222 that includes cross-coupled NANDs 224 and 226. Since both of the inputs to the latch 222 (i.e., outputs of the flip-flops 208 and 210) start low, both outputs 228 and 230 of the latch start high. Whichever phase of the first phase 200 and the second phase 202 transitions first will cause a corresponding flip-flop 208 or 210 to transition high. This will cause a corresponding output 228 or 230 to transition low due to the corresponding NAND gate 224 or 226. For example, if the first phase 200 transitions high first, the flip-flop 208 will transition high. Accordingly, two high values are passed to the NAND gate 224, which causes the output 228 to transition low. Likewise, if the second phase transitions low first, the output 230 transitions low. After an output 228 or 230 has transitioned low, the corresponding output will remain low until the RstF signal 206 transitions low. Once one output transitions high, it holds the other output low using the latch 222 when a phase corresponding to the other output transitions high. In other words, when an output goes low, it causes the other phase to be ignored so that only a first phase between resets is used to capture the write start signal 64.

The output 228 controls clocking of the write start signal 64 into the flip-flop 216. Similarly, the output 230 controls clocking of the write start signal 64 into the flip-flop 218. Specifically, a pulse of the first phase 200 causes the flip-flop 212 to clock in the write start signal 64 using an inverter 232 to provide differential clocking for the flip-flop 212. Similarly, a pulse of the second phase 202 causes the flip-flop 214 to clock in the write start signal 64 using an inverter 234 to provide differential clocking for the flip-flop 214. However, these clocked-in write start signals 64 are suppressed from becoming an output WrLevOut signal 236 until either the flip-flop 216 or 218 passes through the clocked-in write start signals 64 using the outputs 228 and 230, respectively.

An inverter 238 inverts the output 228 into a NAND gate 240 to enable clocking of the flip-flop 216 when the first phase 200 transitions before the second phase 202. Delays 242 may be included to delay an output of the flip-flop 208 to provide timing to properly sample whether the first phase 200 successfully captured the write start signal 64 using the flip-flop 212. The output of the NAND gate 240 clocks the flip-flop 216 using an inverter 244 to provide differential clocking.

An inverter 246 inverts the output 230 into a NAND gate 248 to enable clocking of the flip-flop 218 when the second phase 202 transitions before the first phase 200. Delays 250 may be included to delay an output of the flip-flop 210 to provide timing to properly sample whether the second phase 202 successfully captured the write start signal 64 using the flip-flop 214. The output of the NAND gate 248 clocks the flip-flop 218 using an inverter 252 to provide differential clocking.

Thus, whichever phase occurs first after a reset cause a corresponding flip-flop 216 or 218 to output high. When the flip-flop 216 or the flip-flop 218 transitions high, the WrLevOut signal 236 also transitions high via a NOR gate 254 and inverter 256.

Figure 6:
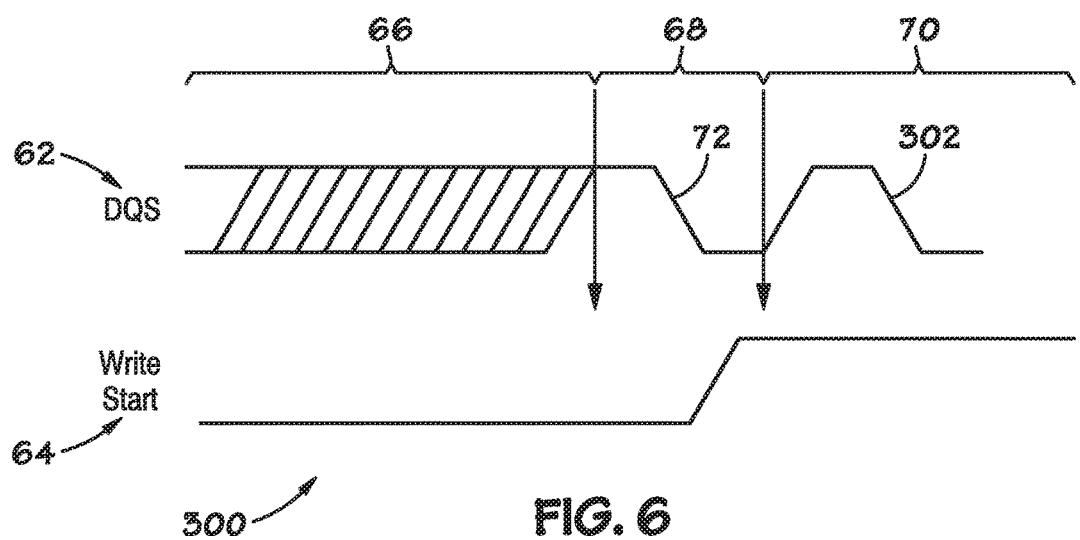
FIG. 6 is a timing diagram that captures a write start signal using the arbiter circuitry of FIG. 5, according to an embodiment of the present disclosure.

The foregoing pertains to write preambles 68 of a write operation having duration of a length (e.g., 2 or 3 nCKs) of the DQS signal 62 sufficient to capture the write start signal 64 with a first falling edge 72 of the DQS signal 62. However, if a write operation has a write preamble 68 having a duration of 1 nCK, the duration may not be sufficient to capture the write start signal 64. Additionally or alternatively, in some embodiments, a specification (e.g., DDR5 specification) may define the duration of one length (e.g., 2 or 3 nCKs) to start the DQS signal 62 low, such that the DQS signal 62 transitions from low to high and back to low causing the first falling edge to be the capture edge. However, the specification may define WPre1 cases to start the DQS signal 62 high, such that the DQS signal 62 transitions low then high then low again causing a second falling edge to be the capture edge. For example, FIG. 6 illustrates a timing diagram 300 that captures the write start signal 64 using a second falling edge 302 of the DQS signal 62 instead of the first falling edge 72 used in FIG. 2. The second falling edge 302 is used for the timing diagram 300 because the write start signal 64 cannot be captured by the first falling edge 72 since the first falling edge 72 occurs before the write start signal 64 is asserted.

Figure 7:
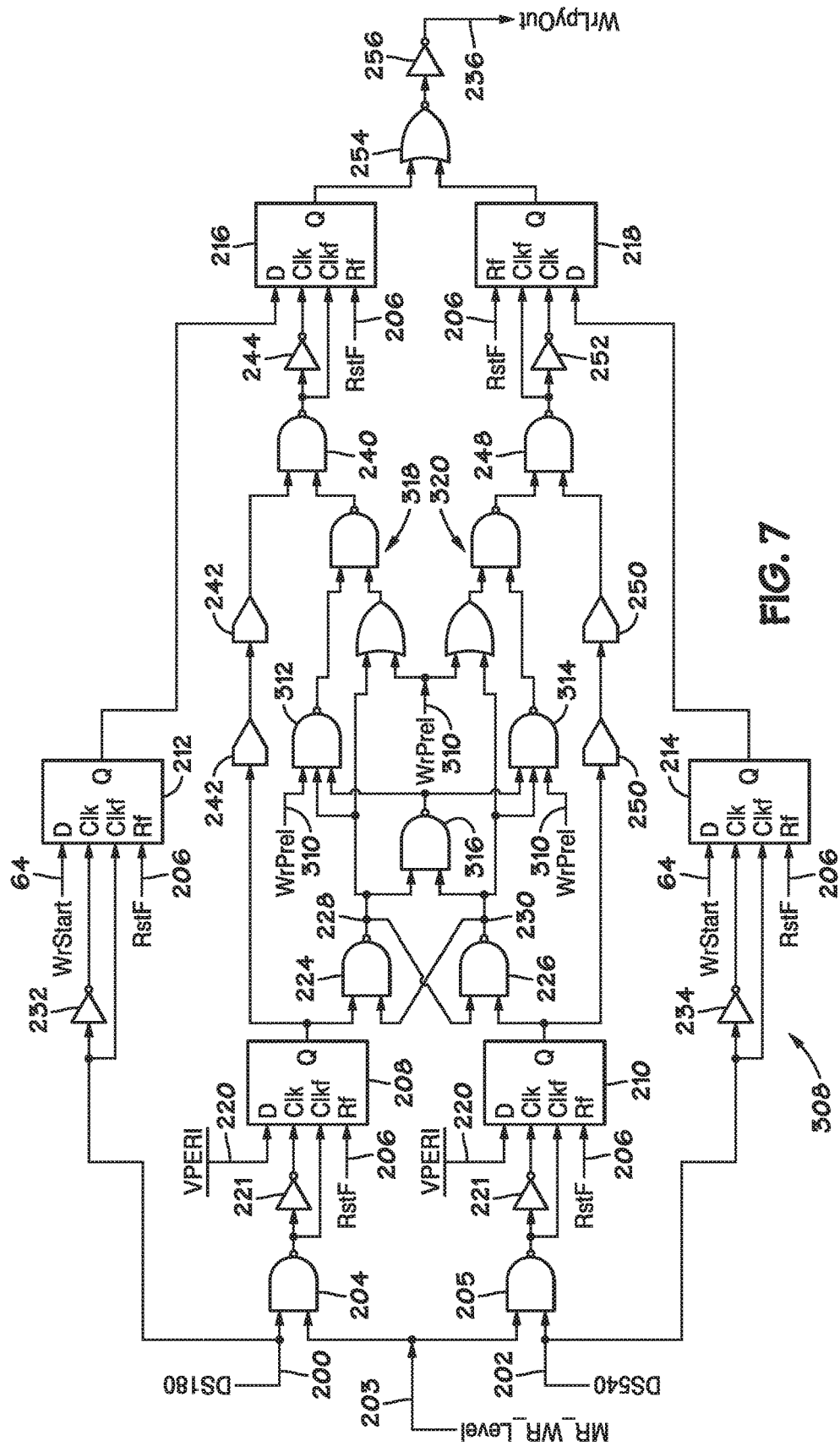
FIG. 7 is a schematic diagram of arbiter circuitry used to detect which of the multiple phases of FIG. 3 is used to capture a write start signal for write leveling based at least in part on a preamble length for a write command corresponding to the write start signal, according to an embodiment of the present disclosure.

FIG. 7 is a schematic diagram of arbiter circuitry 308 that is an embodiment of the arbiter circuitry 50 that is configured to handle multiple preamble lengths, such as 1 nCK, 2 nCK, and 3 nCK preambles. Specifically, when a preamble length is too short to capture the write start signal 64 using the first falling edge 72 of the DQS signal 62 as in the example described above with regard to FIG. 6, a WrPre1 signal 310 may be asserted. When the WrPre1 signal 310 is not asserted, the arbiter circuitry 308 functions similar to the description of the arbiter circuitry 50 discussed in relation for FIG. 5.

However, when the WrPre1 signal 310 is asserted, an effective multiplex is performed so that the outputs 228 and 230 pass through NAND gates 312 and 314, respectively. When a first output (e.g., outputs 228 or 230) of the flip-flops 208 or 210 transitions, the high output causes an enable via the arbiter circuitry 308 in preparation for the other phase. In other words, a logic high for a first occurring pulse on the first phase 200 or the second phase 202 causes the outputs 228 or 230 to enable of clock pathing, but the NAND gate 316 holds both paths as "armed" and waiting for a next phase to be detected. Thus, when the WrPre1 signal 310 is asserted, a first assertion at the first or second phases 200, 202 does not pass the WrLevOut signal 236 but instead prepares the arbiter circuitry 308 for a next assertion of the first or second phases 200, 202. Once one of the outputs 228 and 230 transitions low, the remaining high output 228 or 230 is enabled to pass through the corresponding NAND gate 312 or 314. A multiplexer 318 enables selection of the output 228 as a first occurring pulse for write operations when the WrPre1 signal 310 is not asserted or selection of an output from the NAND gate 312 when the WrPre1 signal 310 is asserted. Similarly, a multiplexer 320 enables selection of the output 230 as a first occurring pulse for write operations when the WrPre1 signal 310 is not asserted or selection of an output from the NAND gate 314 when the WrPre1 signal 310 is asserted. In other words, the multiplexers 318 and 320 enable an output of the WrLevOut 236 when a first occurrence of a first pulse occurs on the first phase 200 or the second phase 202 when the WrPre1 signal 310 is not asserted. When the WrPre1 signal 310 is asserted, the multiplexers 318 and 320 enable an output of the WrLevOut 236 when a subsequent pulse occurs on the first phase 200 or the second phase 202 after the first pulse.

Although the foregoing discusses various logic-low and/or logic-high assertion polarities, at least some of these polarities may be inverted in some embodiments. Furthermore, in some embodiments as discussed herein, logic gates may be replaced with similar logical functions, such as an inverter replaced with a single NAND gate, serially connected NOR gate and inverter being replaced with a single OR gate, or other similar changes.

Figure 8:
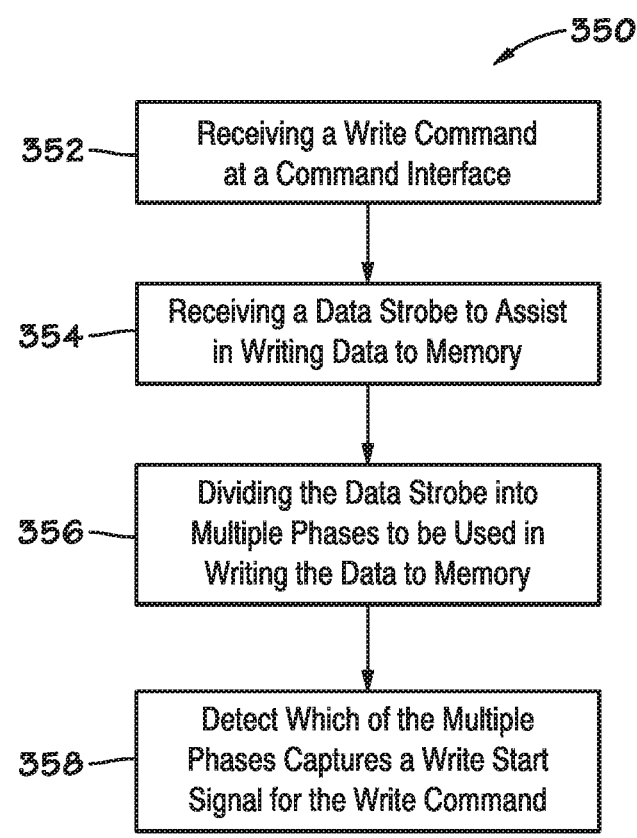
FIG. 8 is a flow diagram of a process used to detect which of the multiple phases of FIG. 3 is used to capture a write start signal using the arbiter circuitry of FIG. 5 or FIG. 7, according to an embodiment of the present disclosure.

FIG. 8 is a flow diagram of a process 350 that may be used with the arbiter circuitry 50 or 308. The process 350 includes receiving a write command at a command interface 14 of the memory device 10 (block 352). The memory device 10 also receives a data strobe to assist in writing the data to memory of the memory device 10 (block 354). Phase divider circuitry 48 is used to divide the data strobe into multiple phases to be used in writing the data to memory (block 356). Arbiter circuitry 50, 308 is used to detect which of the multiple phases captures a write start signal for the write command (block 358).

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(*f*). However, for any claims containing elements designated in any other manner, it is intended that such elements are not to be interpreted under 35 U.S.C. 112(f).

What is claimed is:

1. A semiconductor device comprising:
   memory comprising a group of storage elements;
   a command interface configured to receive a write command to write data to the memory;
   a data strobe pin configured to receive a data strobe to assist in writing the data to the memory;
   phase division circuitry configured to divide the data strobe into a plurality of phases to be used in writing the data to the memory; and
   arbiter circuitry configured to detect which phase of the plurality of phases captures a write start signal for the write command, wherein the arbiter circuitry comprises a latch that is configured to:
   receive a first indication of a pulse in a first phase of the plurality of phases; and
   receive a second indication of a pulse in a second phase of the plurality of phases.

2. The semiconductor device of claim 1, wherein the plurality of phases comprises four phases.

3. The semiconductor device of claim 2, wherein:
   a first phase of the plurality of phases corresponds to rising edges of a first set of pulses of the data strobe;
   a second phase of the plurality of phases corresponds to falling edges of the first set of pulses of the data strobe;
   a third phase of the plurality of phases corresponds to rising edges of a second set of pulses of the data strobe, wherein each pulse of the second set of pulses occurs between two pulses of the first set of pulses; and
   a fourth phase of the plurality of phases corresponds to falling edges of the second set of pulses of the data strobe.

4. The semiconductor device of claim 1, wherein the latch is configured to:
   output a third indication when the pulse in the first phase occurs before the pulse in the second phase after a reset of the arbiter circuitry; or
   output a fourth indication when the pulse in the second phase occurs before the pulse in the first phase after the reset of the arbiter circuitry.

5. The semiconductor device of claim 4, wherein the latch is configured to:
   suppress the fourth indication when the latch outputs the third indication; and
   suppress the third indication when the latch outputs the fourth indication.

6. The semiconductor device of claim 1, comprising a first flip-flop that is configured to receive the pulse in the first phase and to output the first indication when the pulse in the first phase is received.

7. The semiconductor device of claim 6, comprising a second flip-flop that is configured to receive the pulse in the second phase and to output the second indication when the pulse in the first phase is received.

8. The semiconductor device of claim 1, comprising:
a first capture flip-flop configured to capture the write start signal using the first phase; and
a second capture flip-flop configured to capture the write start signal using the second phase.

9. The semiconductor device of claim 8, comprising:
a first suppression flip-flop configured to suppress or pass an output of the first capture flip-flop based at least in part on the first indication; and
a second suppression flip-flop configured to suppress or pass an output of the second capture flip-flop based at least in part on the second indication.

10. The semiconductor of claim 9, wherein the suppression or passing of the outputs of the first and second capture flip-flops is based at least in part on a length of a preamble of the write command.

11. A semiconductor device comprising:
a plurality of memory cells;
a command interface configured to receive a write command to write data to the memory cells;
a data strobe pin configured to receive a data strobe to assist in writing the data to the memory cells;
phase division circuitry configured to receive and divide a data strobe into a plurality of phases to be used in writing the data to the memory cells, wherein the data strobe is configured to assist in writing the data to the memory cells;
arbiter circuitry configured to detect which phase of the plurality of phases captures a write start signal for the write command, wherein the detection of the plurality of phases is based at least in part on a preamble length for the write command;
a first capture flip-flop configured to capture the write start signal at a first data input using a first phase of the plurality of phases as a clock for the first capture flip-flop; and
a second capture flip-flop configured to capture the write start signal at a second data input using a second phase of the plurality of phases as a clock for the second capture flip-flop.

12. The semiconductor device of claim 11, comprising:
a first suppression flip-flop configured to suppress or pass an output of the first capture flip-flop based at least in part on the first phase and the preamble length for the write command; and
a second suppression flip-flop configured to suppress or pass an output of the second capture flip-flop based at least in part on the second phase and the preamble length for the write command.

13. The semiconductor device of claim 12, wherein the output of the first capture flip-flop is passed to an input of the first suppression flip-flop, a clock input of the first suppression flip-flop is based at least in part on the first phase, the output of the second capture flip-flop is passed to an input of the second suppression flip-flop, and a clock input of the second suppression flip-flop is based at least in part on the second phase.

14. The semiconductor device of claim 13, wherein the first capture flip-flop, the second capture flip-flop, the first suppression flip-flop, and the second suppression flip-flop are configured to receive a reset signal to reset the first capture flip-flop, the second capture flip-flop, the first suppression flip-flop, and the second suppression flip-flop to their respective initial states.

15. A method comprising:
receiving a write command at a command interface of a memory device;
receiving a data strobe to assist in writing data to memory of the memory device;
dividing, using phase divider circuitry, the data strobe into a plurality of phases to be used in writing the data to the memory; and
detecting, using arbiter circuitry, which phase of the plurality of phases captures a write start signal for the write command, wherein detecting the phase of the plurality of phases comprises outputting a write leveling output signal as an indication of the detected phase, and detecting the phase is based at least in part on a length of preamble for the write command.

16. The method of claim 15, wherein detecting which phase of the plurality of phases captures a write start signal comprises detecting whether the write start signal is captured by a subset of the plurality of phases.

17. The method of claim 16, wherein the subset of the plurality of phases comprises phases of the plurality of phases that correspond to falling edges of the data strobe.

* * * * *